United States Patent
Lan et al.

(10) Patent No.: US 9,182,641 B2
(45) Date of Patent: Nov. 10, 2015

(54) SIGNAL LINE STRUCTURE OF A FLAT DISPLAY

(75) Inventors: Wei-Chou Lan, Hsinchu (TW);
Sung-Hui Huang, New Taipei (TW);
Chia-Chun Yeh, Hsinchu (TW);
Ted-Hong Shinn, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 349 days.

(21) Appl. No.: 13/166,826

(22) Filed: Jun. 23, 2011

(65) Prior Publication Data

US 2012/0256316 A1 Oct. 11, 2012

(30) Foreign Application Priority Data

Apr. 6, 2011 (TW) .............................. 100111857 A

(51) Int. Cl.
*H01L 23/48* (2006.01)
*H01L 23/52* (2006.01)
*H01L 29/40* (2006.01)
*G02F 1/1362* (2006.01)
*G09G 3/20* (2006.01)
*H01L 27/12* (2006.01)

(52) U.S. Cl.
CPC *G02F 1/136286* (2013.01); *G02F 2001/13629* (2013.01); *G09G 3/20* (2013.01); *G09G 2300/0421* (2013.01); *H01L 27/124* (2013.01)

(58) Field of Classification Search
CPC .................. G01F 1/136259; G01F 1/13629
USPC ...................... 257/59, 72, 749, 758
See application file for complete search history.

(56) References Cited

U.S. PATENT DOCUMENTS

| 5,532,853 | A  | * | 7/1996 | Song et al. ................. 349/149 |
| 6,429,909 | B1 |   | 8/2002 | Kim et al. |
| 6,717,634 | B2 | * | 4/2004 | Kim et al. .................. 349/54 |
| 7,515,243 | B2 | * | 4/2009 | Watamura ................... 349/192 |

(Continued)

FOREIGN PATENT DOCUMENTS

| CN | 1580915 A | 2/2005 |
| CN | 1941410 A | 4/2007 |
| JP | 2003222905 A * | 8/2003 |

(Continued)

OTHER PUBLICATIONS

TW Office Action that these art references were cited.

(Continued)

*Primary Examiner* — Howard Weiss
(74) *Attorney, Agent, or Firm* — CKC & Partners Co., Ltd.

(57) ABSTRACT

The signal line structure is disposed between a gate driver and a display area of a display. The signal line structure includes a substrate, first metal layers, a first insulation layer, second metal layers, a second insulation layer and third metal layers. The first metal layers are arranged in parallel and toward a first direction in the substrate. The first insulation layer is disposed in the substrate and covers the first metal layers. The second metal layers are disposed on the positions of the first insulation layer corresponding to the first metal layers. The second insulation layer is disposed on the second metal layers and the first insulation layer. The third metal layers are disposed on the positions corresponding to the second metal layers in the second insulation layer. The distance between two adjacent second metal layers is less than that between two adjacent first metal layers.

10 Claims, 5 Drawing Sheets

(56) References Cited

U.S. PATENT DOCUMENTS

| | | | |
|---|---|---|---|
| 8,045,084 B2* | 10/2011 | Baek et al. | 349/54 |
| 2010/0051335 A1* | 3/2010 | Chen et al. | 174/257 |

FOREIGN PATENT DOCUMENTS

| | | |
|---|---|---|
| JP | 2007034305 A | 2/2007 |
| TW | 397924 B | 7/2000 |
| TW | 200715017 A | 4/2007 |
| TW | 200823583 A | 6/2008 |
| TW | 201011375 A | 3/2010 |
| TW | 201024874 A | 7/2010 |

OTHER PUBLICATIONS

Chinese Office Action that these art references were cited.

* cited by examiner

SIGNAL LINE STRUCTURE OF A FLAT DISPLAY

RELATED APPLICATIONS

This application claims priority to Taiwan Application Serial Number 100111857, filed Apr. 6, 2011, which is herein incorporated by reference.

BACKGROUND OF THE INVENTION

1. Field of Invention

The present invention relates to a signal line structure. More particularly, the present invention relates to a signal line structure of a flat display.

2. Description of Related Art

Regarding the developing of display technology, novel displays have been used in portable computer, mobile phone, digital camera and other electronic products. Among those displays, flat display is the most potential displays.

FIG. 1 is a cross-sectional view of a typical flat display device. Flat display device 100 comprises a first substrate 110 with a thin film transistor array, a second substrate 120, a material layer 130 and a transparent electrode layer 140. The transparent electrode layer 140 is made of indium tin oxide (ITO), indium zinc oxide (IZO) or other transparent conducting materials. The material layer 130 is formed between the transparent electrode layer 140 and the pixel electrode 112 of the thin film transistor array in the first substrate 110. The optical property of each pixel in the display device 100 can be modified by changing the electric field between the pixel electrode 112 and the transparent electrode layer 140.

FIG. 2 is a top view of the flat display device 100 in FIG. 1. The flat display device 100 comprises a display area 102 and a peripheral circuit area 104 surrounding the display area 102. Data lines 154 and scan lines 152 disposed on the display area 102 to divide the display area 102 into a plurality of pixel areas 110a. Thin film transistors 114 and pixel electrodes 112 are formed in the pixel area 110a. The thin film transistors 114 are connected to corresponding scan lines 152 and data lines 154. The pixel electrodes 112 are connected to the thin film transistors 114. A plurality of gate drivers 142 and source drivers 144 are formed on the peripheral circuit device 104. The gate drivers 142 connected to scan lines 152 transmit driving signal from scan lines 152 to the gates of the thin film transistors 114 and turn on the thin film transistor 114 when displaying images. Source drivers 144 connected to data lines 154 are able to transmit image data to the pixel electrodes 112 when the thin film transistors 114 are turned on.

FIG. 3 is an enlarged diagram of the area in the gate driver. For saving the area of the peripheral circuit device 104, the separated distance A between two adjacent scan lines, such as scan line 152a and scan line 152b, located in the area 156 is required to reduce. In such structure, when a high level drive voltage signal is transferred to the scan line 152a, a low level drive voltage signal is transferred to the scan line 152b. A voltage difference is generated between the scan line 152a and the scan line 152. When the distance A is further reduced, the voltage difference will generate a huge electric field that causes the scan line 152a and the scan line 152 being etched broken to affect the transmission of the drive signal thereon.

Therefore, a signal line structure that can prevent the etching situation is required.

SUMMARY OF THE INVENTION

An aspect of the present invention is to provide a signal line structure with a sacrificial layer to resolve the etching broken problem.

In accordance with the foregoing aspect of the present invention, a signal line structure is provided. The signal line structure is disposed between a gate driver and a display area of a display. The signal line structure includes a substrate, a plurality of first metal layer, a first insulation layer, a plurality of second metal layer, a second insulation layer and a plurality of third metal layer. The first metal layers are arranged in parallel and toward a first direction in the substrate. The first insulation layer is disposed in the substrate and covers the first metal layers. The second metal layers are disposed on the positions of the first insulation layer corresponding to the first metal layers. The second insulation layer is disposed on the second metal layers and the first insulation layer. The third metal layers are disposed on the positions corresponding to the second metal layers in the second insulation layer. The distance between two adjacent second metal layers is less than the distance between two adjacent first metal layers.

In an embodiment of the present invention, the substrate is a glass substrate or a plastic substrate.

In an embodiment of the present invention, the material for forming the first insulation layer is $SiN_x$, $SiO_x$, $AlO_x$, or $Y_2O_3$.

In an embodiment of the present invention, the material for forming the second insulation layer is $SiN_x$, $SiO_x$, $AlO_x$, $Y_2O_3$, Resin, Polymid series or a compound including organic material and inorganic material.

In an embodiment of the present invention, the material for forming the third metal layers is indium tin oxide (ITO), indium zinc oxide (IZO), Mo, Cr. MoCr or other transparent conducting materials.

In an embodiment of the present invention, the material for forming the first metal layers is Mo, Cr. MoCr, Cu, Al, Ni. Ti, Ta, AlNd or a combination of the above materials.

In an embodiment of the present invention, the material for forming the second metal layers is Mo, Cr. MoCr, Cu, Al, Ni. Ti, Ta, AlNd or a combination of the above materials.

In an embodiment of the present invention, the signal line structure i transfers scan signals generated by the gate driver to scan lines in the display area.

In an embodiment of the present invention, a plurality of first contact window is formed in the first insulation layer. The third metal layers couple with the first metal layers through the first contact windows. A plurality of second contact window is formed in the second insulation layer. The third metal layers couple with the second metal layers through the first contact windows.

In an embodiment of the present invention, the length of the second metal layers in the first direction is less than the length of the first metal layers in the first direction.

Accordingly, the signal line structure that is located between the gate driver and the display area is a multiplayer metal layer structure. One of the metal layers is a sacrificial layer. Therefore, even though an etching event happens, the sacrificial layer can smooth the main signal line is etched to increase the lifetime of the display.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
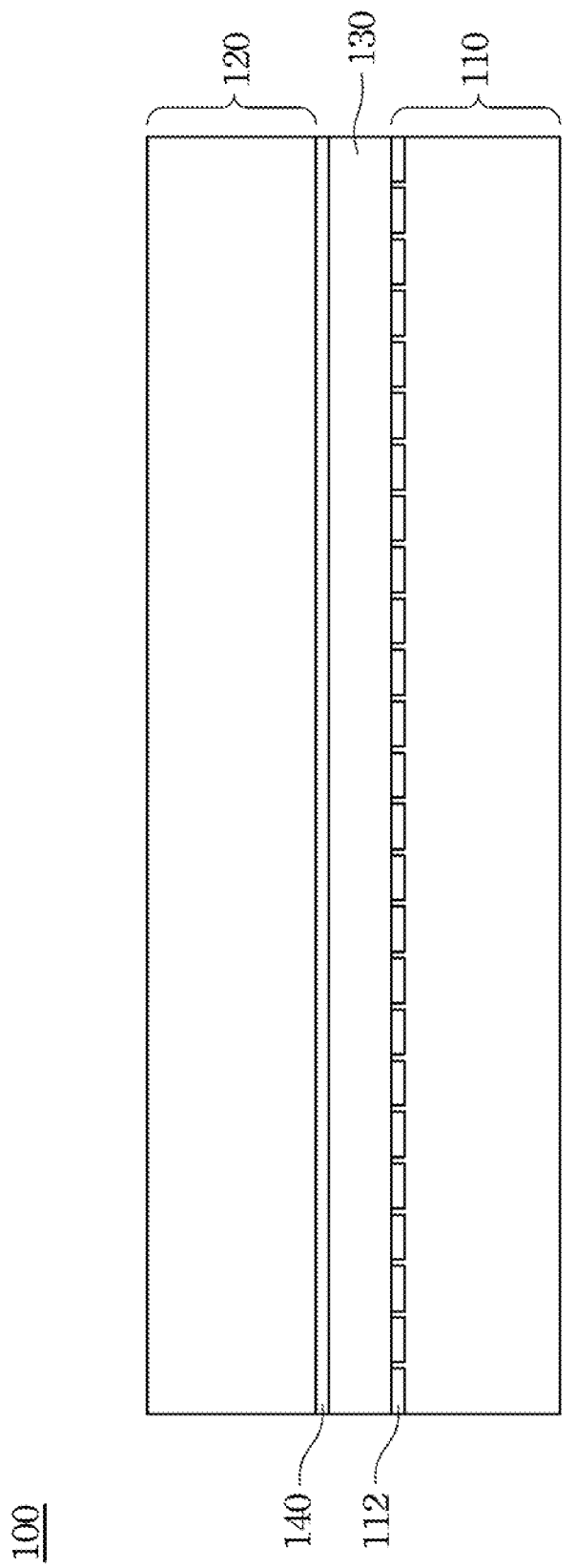
FIG. 1 is a cross-sectional view of a flat display device of this invention, according to one preferred embodiment of this invention.
Figure 2:
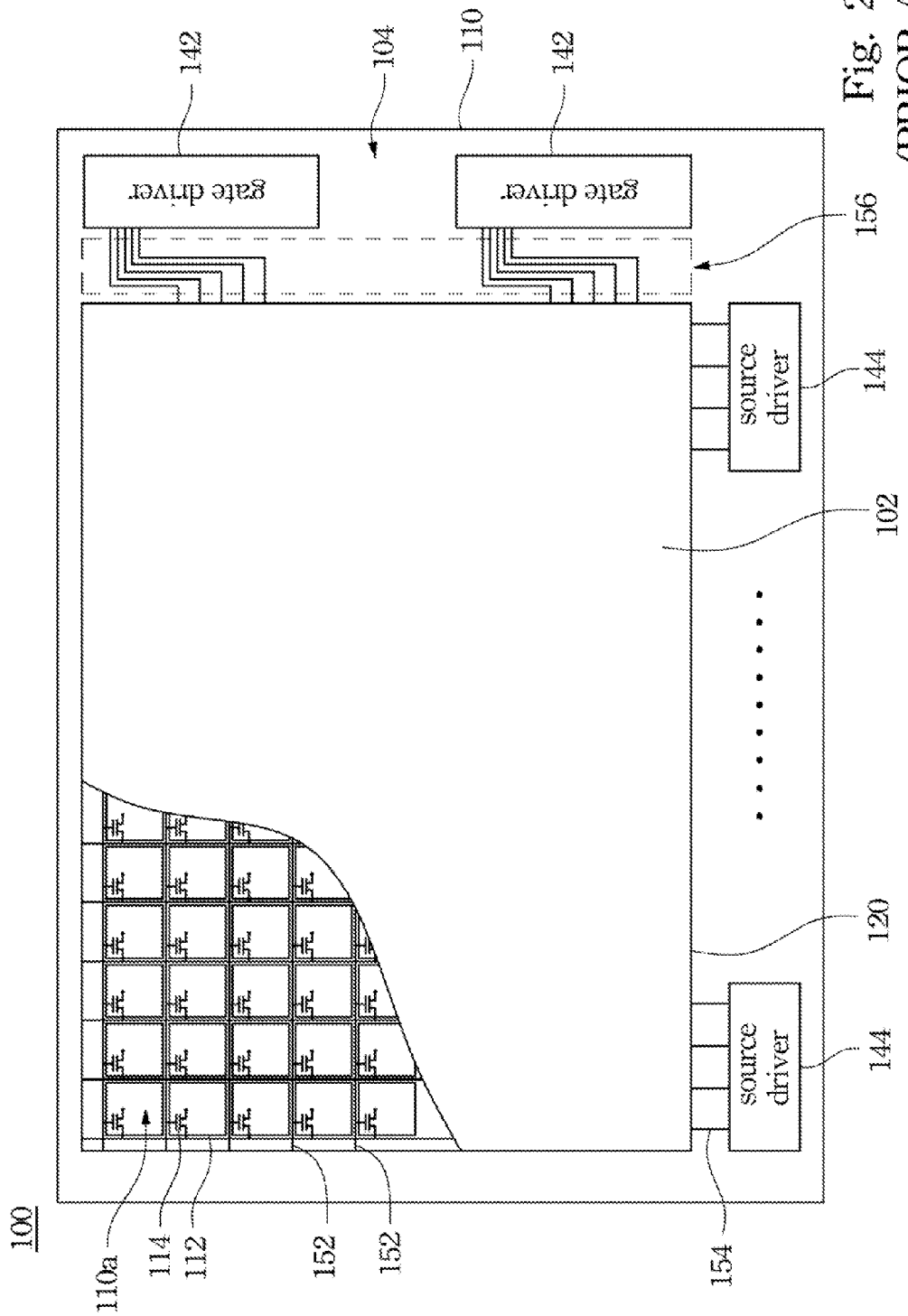
FIG. 2 is a top view of the flat display device in FIG. 1.
Figure 3:
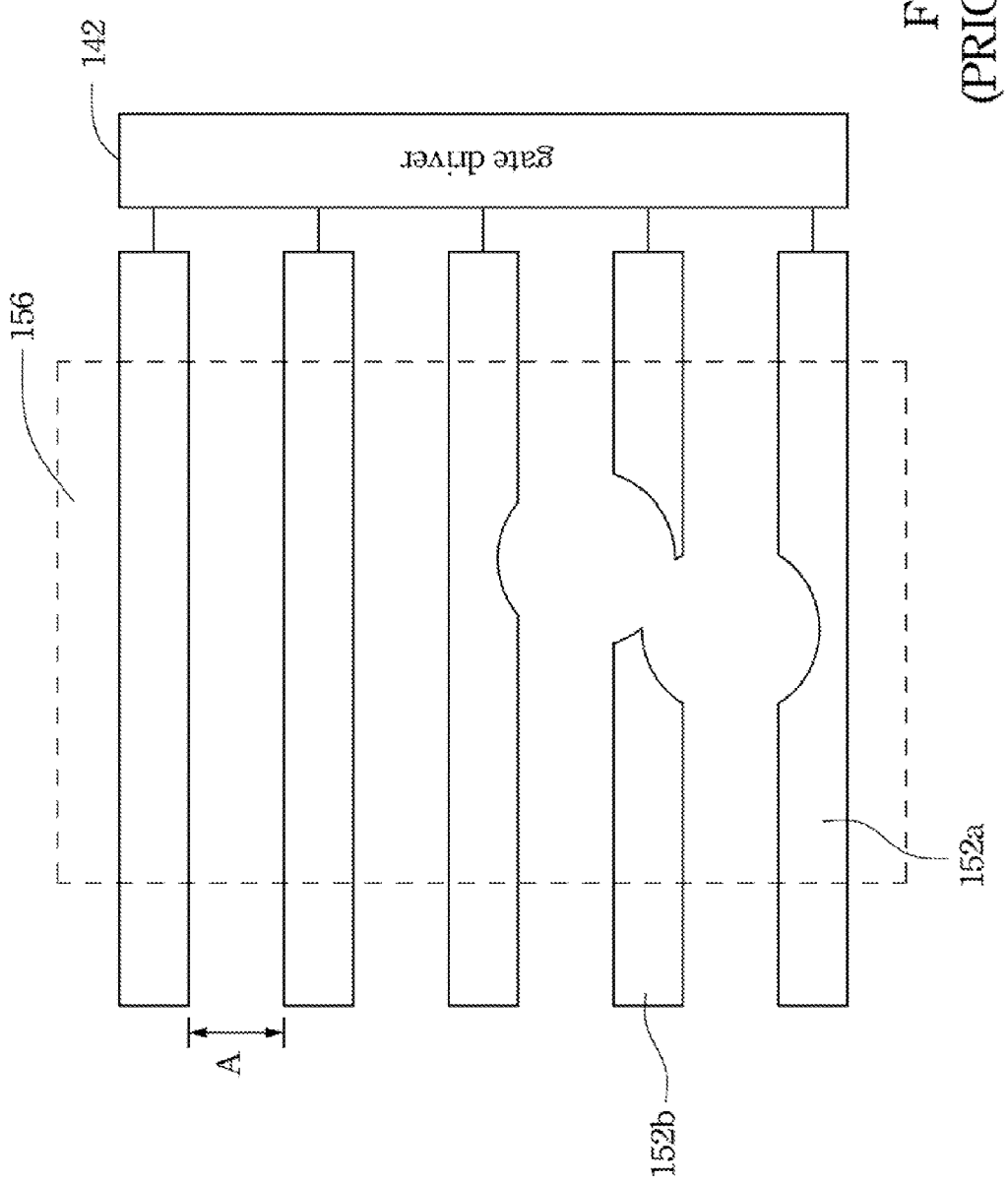
FIG. 3 is an enlarged diagram of the area in the gate driver.

Please refer to FIG. 3, a typical scan line located outside of the display is composed of a single metal layer, such as a first metal layer, to connect with the gate driver 142. Such a single metal layer is very easily broken because of being etched by a large electric field between two adjacent scan lines to affect the display quality. Therefore, to prevent the foregoing problem and improve the display quality, a multiplayer metal layer structure is formed to smooth the main signal line is etched to improve the display quality.

Figure 4:
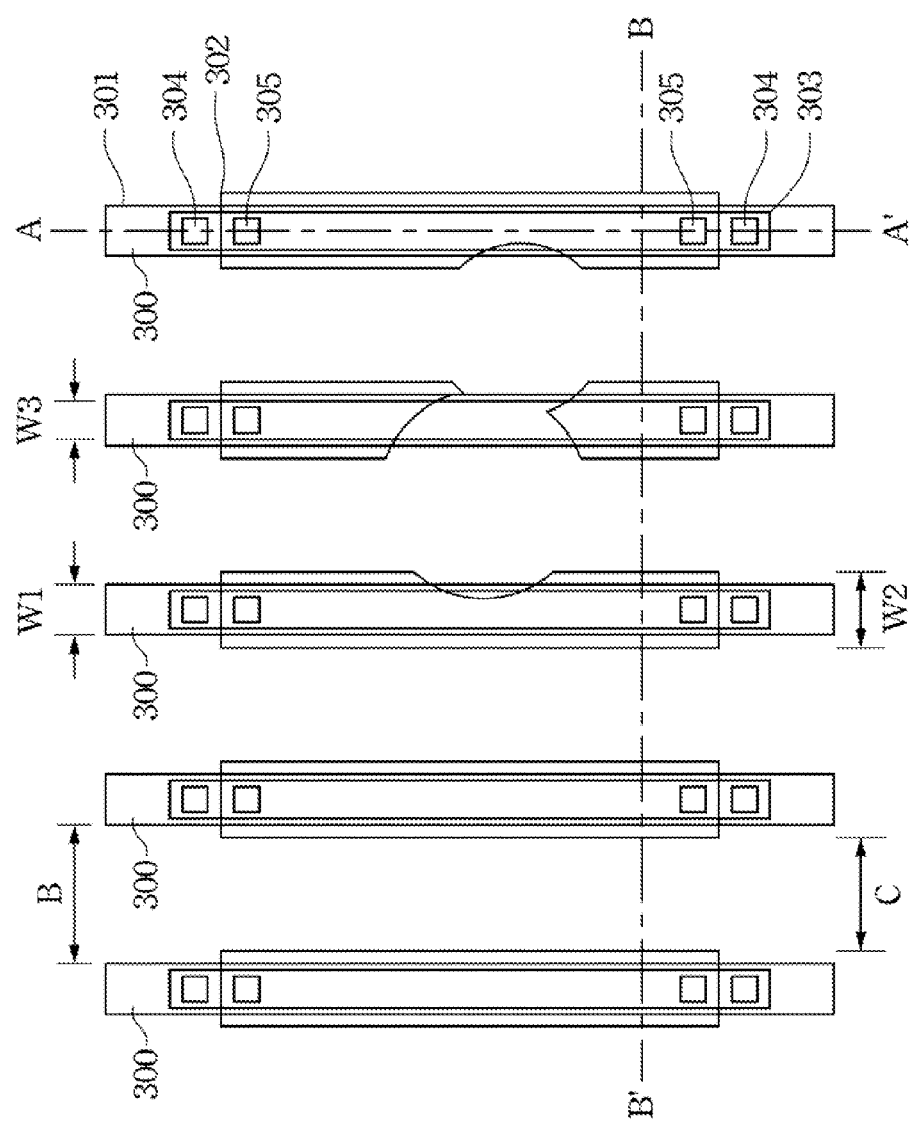
FIG. 4 is a top view of the scan lines located outside of the display area.

FIG. 4 is a top view of the scan lines located outside of the display area. Each of the scan lines 300 located in the area 156 (shown in the FIG. 3) has a multiplayer metal layer structure. The scan line 300 includes a first metal layer 301, a second metal layer 302 and a transparent electrode layer 303. The second metal layer 302 is disposed on the first metal layer 301 to serve as a sacrificial electrode layer. The transparent electrode layer 303 is disposed on the second metal layer 302. The transparent electrode layer 303 is connected to the first metal layer 301 through contact windows 304 and is connected to the second metal layer 302 through contact windows 305. Therefore, the first metal layer 301 is connected to the second metal layer 302 through the transparent electrode layer 303. In an embodiment, the width W2 of the second metal layer 302 is larger than the width W1 of the first metal layer 301. The width W1 of the first metal layer 301 is larger than the width W3 of the transparent electrode layer 303. The distance C between two second metal layers 302 of two adjacent scan lines 300 respectively is equal to the distance A between two adjacent scan lines 152 in a typical technology. Therefore, according to the present invention, the distance B between two first metal layers 301 of two adjacent scan lines 300 respectively is larger than the distance A between two adjacent scan lines 152 in a typical technology. The electric field between two adjacent first metal layers 301 is less than that between two adjacent scan lines 152 in a typical technology. The etching situation for the scan lines 300 is smoothed. Moreover, even though an etching situation happens, the probability of the scan lines 300 being etched broken is reduced because of the second metal layers 302 can act as sacrificial layers. On the other hand, the multiplayer metal layer structure can reduce the resistance to improve the drive signal.

Figure 5:
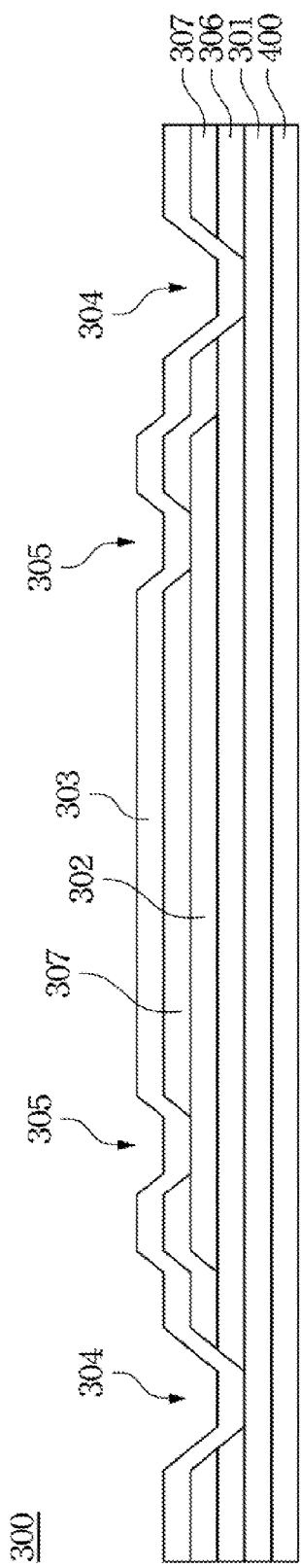
FIG. 5 is a cross-sectional view of the scan lines from the AA' line in the FIG. 4.

FIG. 5 is a cross-sectional view of the scan lines from the AA' line in the FIG. 4. Each of the scan lines 300 located in the area 156 (shown in the FIG. 3) has a multiplayer metal layer structure. The scan line 300 includes a substrate 400, a first metal layer 301, a first insulation layer 306, a second metal layer 302, a second insulation layer 307 and a transparent electrode layer 303. The first metal layer 301 is arranged in parallel and toward a first direction in the substrate 400. The first insulation layer 306 is disposed in the substrate 400 and covers the first metal layer 301. A plurality of contact windows 304 is formed in the first insulation layer 306 to expose partial surface of the first metal layer 301. The second metal layer 302 is disposed on the first insulation layer 306 to serve as a sacrificial layer. The length in the first direction of the second metal layer 302 is less than that of the first metal layer 301 to expose the contact windows 304 as shown in the FIG. 4. The second insulation layer 307 is disposed on the second metal layer 302. A plurality of contact windows 305 is formed in the second insulation layer 307 to expose partial surface of the second metal layer 302. The transparent electrode layer 303 is disposed on the second insulation layer 307. The transparent electrode layer 303 is electrically connected to the first metal layer 301 through the contact windows 304 in the first insulation layer 306. The transparent electrode layer 303 is electrically connected to the second metal layer 302 through the contact windows 305 in the second insulation layer 307.

Figure 6:
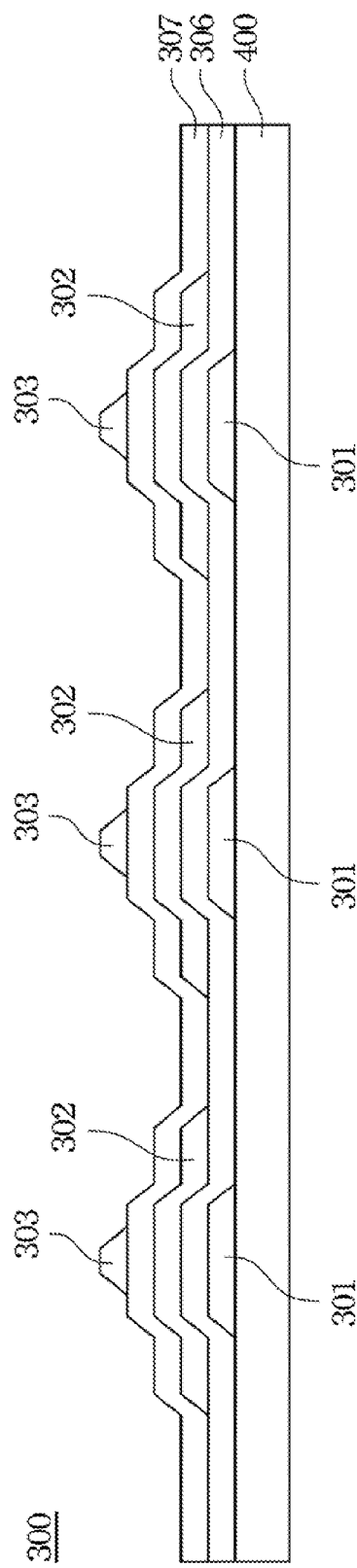
FIG. 6 is a cross-sectional view of the scan lines from the BB' line in the FIG. 4.

FIG. 6 is a cross-sectional view of the scan lines from the BB' line in the FIG. 4. A plurality of first metal layers 301 is arranged in parallel in the substrate 400. The first insulation layer 306 is disposed in the substrate 400 and covers the first metal layers 301. A plurality of second metal layers is disposed on the positions of the first insulation layer 306 corresponding to the first metal layers 301 to serve as sacrificial layers. The second insulation layer 307 is disposed icy on the second metal layers 302 and the first insulation layer 306 to serve as a protection layer. A plurality of transparent electrode layers 303 is disposed on the positions corresponding to the second metal layers 302 in the second insulation layer 306. The transparent electrode layers 303 are connected to the first metal layers 301 and the second metal layers 302 through contact windows (not shown in this FIG. 6). The substrate 400, for example, is a glass substrate or a plastic substrate. The material for forming the first insulation layer 306, for example, is $SiN_x$, $SiO_x$, $AlO_x$, or $Y_2O_3$. The material for forming the second insulation layer 307, for example, is $SiN_x$, $SiO_x$, $AlO_x$, $Y_2O_3$, Resin, Polymid series or a compound including organic material and inorganic material. The material for forming the transparent electrode layer 303, for example, is indium tin oxide (ITO), indium zinc oxide (IZO), Mo, Cr. MoCr or other transparent conducting materials. The material for forming the first metal layer 301, for example, is Mo, Cr. MoCr, Cu, Al, Ni. Ti, Ta, AlNd or a combination of the above materials. The material for forming the second metal layer 302, for example, is Mo, Cr. MoCr, Cu, Al, Ni. Ti, Ta, AlNd or a combination of the above materials.

Moreover, comparing with the typical single-layer structure of scan line 152 as shown in FIG. 3, the multiplayer metal layer structure of scan line 300 additionally includes a first insulation layer 306, second metal layers 302, a second insulation layer 307 and transparent electrode layers 303. However, it is not necessary to increase the process steps for the additional layers. That is, these layers and the thin film transistors on the display area can be formed together. For example, the first insulation layer 306 and the gate insulation layer of the thin film transistors on the display area can be formed together. The second metal layers 302 and the source/drain electrodes of the thin film transistors on the display area can be formed together. The second insulation layer 307 and the protection layer of the thin film transistors on the display area can be formed together. The transparent electrode layers and the pixel electrodes of the thin film transistors on the display area can be formed together.

Accordingly, the scan line structure that is located between the gate driver and the display area is a multiplayer metal layer structure. One of the metal layers is a sacrificial layer. Therefore, even though an etching event happens, the sacrificial layer can smooth the main signal line of the scan line is etched to increase the lifetime of the display. Moreover, the multiplayer metal layer structure of scan line and the thin film transistors on the display area can be formed together. Therefore, it is not necessary to increase the process steps for the multiplayer metal layer structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A signal line structure disposed between a gate driver and a display area of a display, comprising:
a substrate;
a plurality of first metal layers, wherein the first metal layers are arranged in parallel in the substrate and extended along a first direction;
a first insulation layer, wherein the first insulation layer covers the first metal layers;
a plurality of second metal layers, wherein the second metal layers are disposed on the first insulation layer, the second metal layers are arranged parallel to the first metal layers and extended along the first direction, the first insulation layer is interposed between the first metal layers and the second metal layers to prevent the first metal layers from directly contacting the second metal layers, and one of the first metal layers and a corresponding one of the second metal layers parallelly transmit an identical signal from the gate driver over a first resistance, the first resistance formed by the one of the first metal layers and the corresponding one of the second metal layers is lower than a resistance formed by any one of the one of the first metal layers and the corresponding one of the second metal layers alone;
a second insulation layer, wherein the second insulation layer is disposed on the second metal layers and the first insulation layer;
a plurality of third metal layer, wherein the third metal layers are disposed on the second metal layers, and the first metal layer is electrically connected to the second metal layer through the third metal layer; and
a plurality of first contact windows formed in the first insulation layer,
wherein the second metal layers are wider than the first metal layers on a second direction perpendicular to the first direction and shorter than the first metal layers on the first direction, so that one of the second metal layers partially covers a corresponding first metal layer of the first metal layers and exposes two exposed portions of the corresponding first metal layer opposite to each other, and two corresponding contact windows of the first contact windows are formed on the two exposed portions of the corresponding first metal layer respectively, so that the corresponding first metal layer of the first meal layers couple with corresponding third metal layer of the third metal layers through the two corresponding contact windows of the first contact windows.

2. The signal line structure of claim 1, wherein the substrate is a glass substrate or a plastic substrate.

3. The signal line structure of claim 1, wherein a material for forming the first insulation layer is $SiN_x$, $SiO_x$, $AlO_x$, or $Y_2O_3$.

4. The signal line structure of claim 1, wherein a material for forming the second insulation layer is $SiN_x$, $SiO_x$, $AlO_x$, $Y_2O_3$, Resin, Polymid series or a compound including organic material and inorganic material.

5. The signal line structure of claim 1, wherein a material for forming the third metal layers is indium tin oxide (ITO), indium zinc oxide (IZO), Mo, Cr. MoCr or other transparent conducting materials.

6. The signal line structure of claim 1, wherein a material for forming the first metal layers is Mo, Cr. MoCr, Al, Ni. Ti, Ta, AlNd or a combination of the above materials.

7. The signal line structure of claim 1, wherein a material for forming the second metal layers is Mo, Cr. MoCr, Cu, Al, Ni. Ti, Ta, AlNd or a combination of the above materials.

8. The signal line structure of claim 1, wherein the signal line structure transfers scan signals generated by the gate driver to scan lines in the display area.

9. The signal line structure of claim 1, further comprising a plurality of second contact windows, wherein the second contact windows are formed in the second insulation layer, the third metal layers couple with the second metal layers through the second contact windows.

10. The signal line structure of claim 9, wherein a length of the second metal layers in the first direction is less than a length of the first metal layers in the first direction.

* * * * *